(12) United States Patent
Tzoufras

(10) Patent No.: US 11,574,194 B2
(45) Date of Patent: Feb. 7, 2023

(54) SYSTEM AND METHOD FOR TRAINING NEURAL NETWORKS WITH ERRORS

(71) Applicant: Integrated Silicon Solution, (Cayman) Inc., Grand Cayman (KY)

(72) Inventor: Michail Tzoufras, Fremont, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 987 days.

(21) Appl. No.: 16/367,078

(22) Filed: Mar. 27, 2019

(65) Prior Publication Data

US 2020/0311555 A1    Oct. 1, 2020

(51) Int. Cl.
| | | |
|---|---|---|
| *G06N 3/08* | (2006.01) | |
| *G06N 3/084* | (2023.01) | |
| *G06N 3/04* | (2023.01) | |
| *G11C 11/16* | (2006.01) | |
| *G06K 9/62* | (2022.01) | |
| *G06N 3/063* | (2023.01) | |

(52) U.S. Cl.
CPC ............ *G06N 3/084* (2013.01); *G06K 9/6267* (2013.01); *G06N 3/0472* (2013.01); *G06N 3/063* (2013.01); *G11C 11/16* (2013.01)

(58) Field of Classification Search
CPC .... G06K 9/6267; G06N 3/0472; G06N 3/063; G06N 3/084; G11C 11/16; G11C 11/1673; G11C 11/1675; G11C 11/54
See application file for complete search history.

(56) References Cited

U.S. PATENT DOCUMENTS

2020/0241840 A1* 7/2020 Ikegami .............. G11C 11/1657

OTHER PUBLICATIONS

Locatelli et al., "Use of Magnetoresistive Random-Access Memory as Approximate Memory for Training Neural Networks", Jan. 21, 2019, 2018 25th IEEE International Conference on Electronics, Circuits and Systems (ICECS), pp. 553-556. (Year: 2019).*
Xu et al., "STT-MRAM Design Technology Co-optimization for Hardware Neural Networks", Dec. 5, 2018, 2018 IEEE International Electron Devices Meeting (IEDM), pp. 1-4. (Year: 2018).*
Wang et al., "Approximate On-chip Memory Optimization Method for Deep Residual Networks", Nov. 21, 2018, 2018 IEEE 23rd International Conference on Digital Signal Processing (DSP), pp. 1-5. (Year: 2018).*

(Continued)

*Primary Examiner* — Brent Johnston Hoover

(57) ABSTRACT

A computing device includes one or more processors, random access memory (RAM), and a non-transitory computer-readable storage medium storing instructions for execution by the one or more processors. The computing device receives first data on which to train a neural network comprising at least one quantized layer and performs a set of training iterations to train weights for the neural network. Each training iteration of the set of training iterations includes stochastically writing values to the random access memory for a set of activations of the at least one quantized layer of the neural network using first write parameters corresponding to a first write error rate. The computing device stores trained values for the weights of the neural network. The trained neural network is configured to classify second data based on the stored values.

20 Claims, 9 Drawing Sheets

(56) References Cited

OTHER PUBLICATIONS

Essam et al., "Dynamic Point Stochastic Rounding Algorithm for Limited Precision Arithmetic in Deep Belief Network Training", May 28, 2017, 8th International IEEE EMBS Conference on Neural Engineering, pp. 629-632. (Year: 2017).*
Spin Memory, Inc., PCT/US2019/066847, International Search Report, Written Opinion, 13 pgs., dated Apr. 15, 2020.
Imani, Canna: Neural Network Acceleration Using Configurable Approximation on GPGPU, 2018 IEEE, 8 pgs.
Venkataramani, Approximate Computing and the Quest for Computing Efficiency, School of Electrical and Computer Engineering, Purdue University, Jun. 7-11, 2015, 6 pgs.
Locatelli, Use of Magnetoresistive Random-Access Memory as Approximate Memory for Training Neural Networks, 2018 25th IEEE International Conference on Electronics, Circuits and Systems (ICECS), Dec. 9, 2018, 4 pgs.

\* cited by examiner

SYSTEM AND METHOD FOR TRAINING NEURAL NETWORKS WITH ERRORS

RELATED APPLICATIONS

This application is related to U.S. patent application Ser. No. 16/367,067 entitled "System and Method for Classifying Data Using a Neural Networks with Errors," filed Mar. 27, 2019, which is hereby incorporated by reference in its entirety.

TECHNICAL FIELD

This relates generally to the field of memory applications, including but not limited to training artificial neural networks using magnetic memory.

BACKGROUND

Modern artificial neural networks (ANNs) train on massive amounts of data to optimize their internal parameters—e.g., their weights and biases—before they are deployed. The training process involves a large number of iterations (i.e., epochs) through labeled training data.

To reduce the amount of memory needed to store these internal parameters, some neural networks (referred to as binary ANNs) binarize one or more of their layers. To that end, on a given iteration, floating point values for the internal parameters (e.g., weights and activations) are determined and then rounded to binary values (e.g., either a "1" or a "−1"), which are stored in the memory.

Interestingly, stochastic rounding leads to more accurate neural networks than deterministic rounding. In a typical stochastic rounding process, a binary value for a parameter is generated stochastically based on an initial floating point value. Thus, for example, a floating point value of 0.57 will be stochastically rounded, with some probability, to a "−1" instead of a "1" before being written to memory. After generating the stochastic value, the value is deterministically written to memory.

However, this process is resource intensive (e.g., requires a large amount of energy usage) due to the need to generate large numbers of stochastic values. For that reason, binary ANNs are often trained using deterministic rounding despite its lesser accuracy.

SUMMARY

Some embodiments of the present disclosure use error-prone memory (e.g., memory prone to write errors) to train a binary artificial neural network (ANN). Because the write process in error-prone memory is itself stochastic, these embodiments obviate the need to generate stochastic parameter values before writing the parameter values to memory. That is, some embodiments train a binary ANN by stochastically writing values for ANN parameters, rather than generating stochastic values for ANN parameters and then writing the values deterministically. Thus, using error-prone memory for at least part of an ANN training process does not affect the efficacy of the training process, and can, in fact, efficiently provide a beneficial degree of stochasticity. Such ANNs include but are not limited to fully-connected networks (FNN) and convolutional neural networks (CNN).

Further, some embodiments of the present disclosure improve the speed and efficiency of an ANN inference (classification) process using binary ANNs by storing at least some of the internal parameters of the ANN in error-prone memory (e.g., memory prone to read errors). An ANN inference process takes, as an input, unlabeled data and classifies it using established neural network parameters (e.g., weights and biases). One of the major detriments to the efficiency of the ANN classification process is the need to bus ANN parameters on and off an inference chip (e.g., from external memory).

Error-prone memory, however, can be made denser than error free memory. For one thing, error-prone memory does not require (or does not require as much) redundancy for error correction, thus freeing that space to store additional information. In addition, some types of memory (e.g., magnetic random access memory) can be made smaller, and thus denser, if error requirements are relaxed. Thus, by using error-prone memory, some embodiments store more ANN parameters on the same sized chip compared to conventional methods and devices, reducing or eliminating the need to bus ANN parameters on and off chip. Further, surprisingly, unlabeled data can be classified using error-prone memory without a significant concomitant increase in prediction errors (e.g., misclassifications by the ANN).

(A1) To that end, in some implementations, a method performed at a computing device is provided. The computing device includes one or more processors, a random access memory (RAM), and a non-transitory computer-readable storage medium storing instructions for execution by the one or more processors. In some embodiments, the non-transitory computer-readable storage medium includes instructions for executing the method. The method includes receiving first data on which to train a neural network comprising at least one quantized layer. The method includes performing a set of training iterations to train weights for the neural network, each training iteration of the set of training iterations including stochastically writing values to the random access memory for a set of activations of the at least one quantized layer of the neural network using first write parameters corresponding to a first write error rate. The method further includes storing trained values for the weights of the neural network, wherein the trained neural network is configured to classify second data based on the stored values.

(A2) In some implementations of (A1), the RAM is magnetic RAM (MRAM).

(A3) In some implementations of any of (A1)-(A2), the first write parameters include a write current selected such that the computing device stochastically writes values to the random access memory at the first write error rate.

(A4) In some implementations of any of (A1)-(A3), the first write parameters include a first write current to write a first value and a second write current to write a second value.

(A5) In some implementations of any of (A1)-(A4), the first write error rate is greater than 1% (or 0.25%, or 0.5% or 0.75%).

(A6) In some implementations of any of (A1)-(A5), the first write error rate is less than 10% (or 15%, or 20%).

(A7) In some implementations of any of (A1)-(A6), the neural network comprises an XNOR neural network.

(A8) In some implementations of any of (A1)-(A7), the neural network further includes one or more non-quantized layers.

(A9) In some implementations of any of (A7)-(A8), each of the at least one quantized layer comprises a binary layer.

(A10) In some implementations of any of (A1)-(A9), the neural network further comprises a second quantized layer and each training iteration of the set of training iterations includes stochastically writing values to the random access memory for a set of activations of the second quantized layer of the neural network using second write parameters corresponding to a second write error rate.

In some implementations, an electronic system is provided. The electronic system comprises one or more processors, a random access memory (RAM), and a non-transitory computer-readable storage medium storing instructions executable by the one or more processors. The instructions include instructions for receiving first data on which to train a neural network comprising at least one quantized layer. The instructions include instructions for performing a set of training iterations to train weights for the neural network, each training iteration of the set of training iterations including stochastically writing values to the random access memory for a set of activations of the at least one quantized layer of the neural network using first write parameters corresponding to a first write error rate. The instructions include instructions for storing trained values for the weights of the neural network, wherein the trained neural network is configured to classify second data based on the stored values.

In some implementations, the electronic system includes a chip.

In some implementations, the electronic system is configured to perform any of the methods (A1)-(A10) described above.

(B1) Further, in some implementations, a method is performed at a computing device that includes one or more processors, a random access memory (RAM), and a non-transitory computer-readable storage medium storing instructions. In some implementations, the non-transitory computer-readable storage medium includes instructions for executing the method. The method includes receiving first data and classifying the data using a neural network that includes at least one quantized layer. The classifying includes reading values from the random access memory for a set of weights of the at least one quantized layer of the neural network using first read parameters corresponding to a first error rate.

(B2) In some implementations of (B1), the neural network further includes at least one floating point layer.

(B3) In some implementations of (B2), the at least one quantized layer comprises at least half of an amount of the RAM used to store the quantized and floating point layers of the neural network.

(B4) In some implementations of any of (B1)-(B3), the classifying does not include performing error detection.

(B5) In some implementations of any of (B1)-(B4), the first error rate comprises read disturb errors and retention errors.

(B6) In some implementations of any of (B1)-(B5), the one or more processors reside on a same chip as the random access memory.

(B7) In some implementations of any of (B1)-(B6), 50%, 60%, 70%, 80%, or 90% of the weights for the entire neural network are binary weights.

(B8) In some implementations of any of (B1)-(B7), the RAM is magnetic RAM.

(B9) In some implementations of any of (B1)-(B8), the first read parameters include a read current selected such that the computing device reads values from the RAM at the first error rate.

(B10) In some implementations of any of (B1)-(B9), the first error rate is greater than 1% (or 0.25%, or 0.5% or 0.75%).

(B11) In some implementations of (B10), the first error rate is less than 10% (or 15%, or 20%).

(B12) In some implementations of any of (B1)-(B11), the neural network comprises an XNOR neural network.

(B13) In some implementations of any of (B1)-(B12), each of the at least one quantized layer comprises a binary layer.

In some implementations, a computing device having one or more processors, a random access memory (RAM), read circuitry configured to read data from the RAM, and a non-transitory computer-readable storage medium is provided. The non-transitory computer-readable storage medium stores instructions for execution by the one or more processors, including instructions for receiving first data and classifying the first data using a neural network that includes at least one quantized layer. The classifying includes reading values from the random access memory for a set of weights of the at least one quantized layer of the neural network using first read parameters corresponding to a first error rate.

In some implementations, the computing device comprises a chip. In some implementations, the computing device comprises a portable multifunction device (e.g., smartphone, smart watch).

In some implementations the electronic system is configured to any of the methods (B1)-(B13) described above.

Although artificial neural networks (ANNs) are used as a specific example of a training process that may benefit from the methods and devices described herein, it should be noted that any resource-intensive optimization process (e.g., statistical process) may also benefit from the methods and device described herein. Thus, some embodiments of the present disclosure apply not only to ANNs, but to any sort of optimization (e.g., statistical) process. Some embodiments of the present disclosure apply to a machine learning process. Such machine learning processes may include supervised learning (e.g., classification, regression), clustering (e.g., latent Dirichlet allocation), dimensionality reduction, structured prediction, anomaly detection, and reinforcement learning. Thus, training a machine learning process may include training a model for any of the above applications.

Thus, devices and systems are provided with methods for optimization processes (e.g., machine learning processes, ANN training, etc.) increasing the effectiveness, efficiency, and user satisfaction with such systems and devices.

BRIEF DESCRIPTION OF THE DRAWINGS

For a better understanding of the various described implementations, reference should be made to the Description of Implementations below, in conjunction with the following drawings in which like reference numerals refer to corresponding parts throughout the figures.

Like reference numerals refer to corresponding parts throughout the several views of the drawings.

DETAILED DESCRIPTION

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

Figure 1:
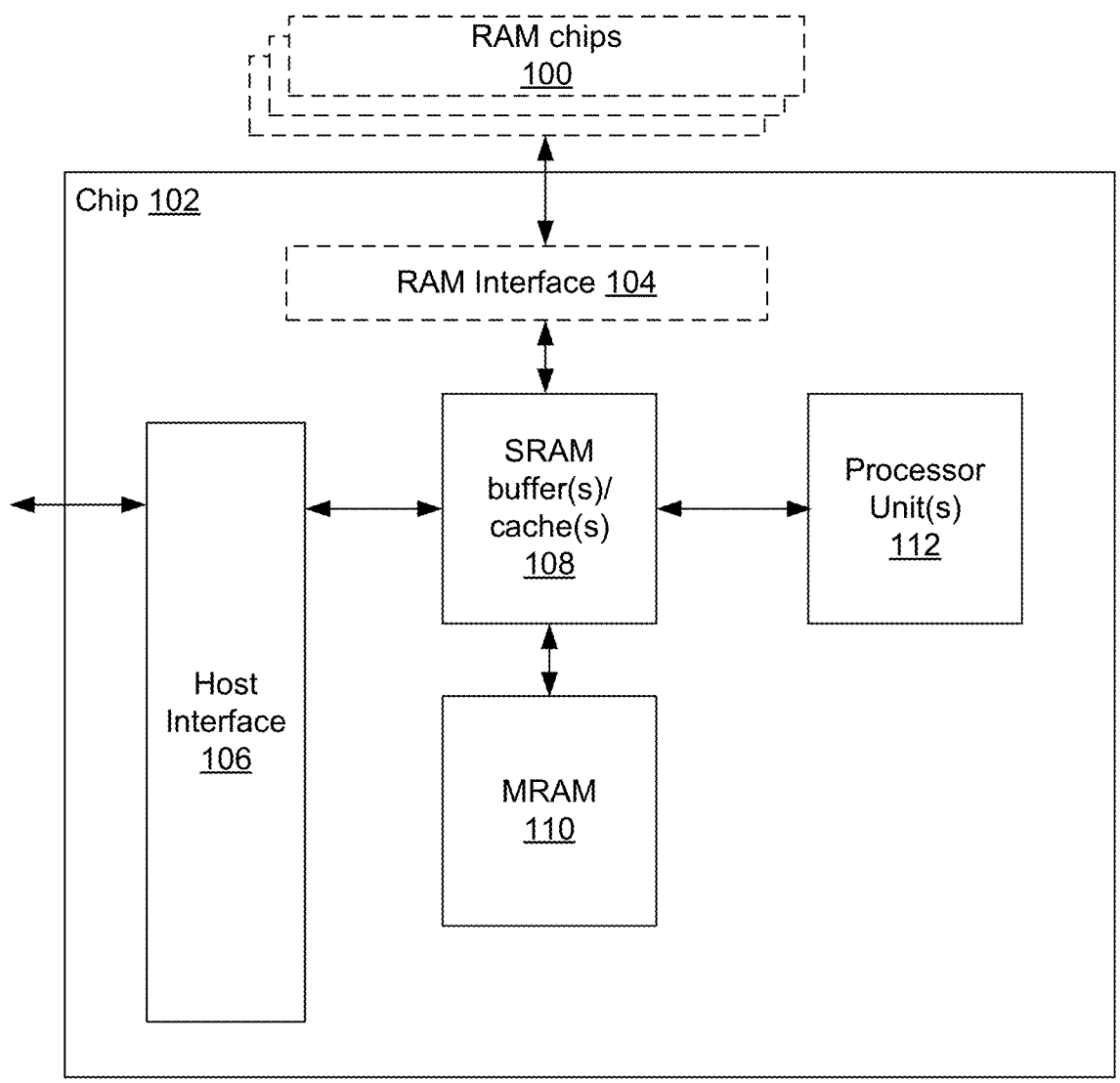
FIG. 1 illustrates a schematic diagram of a chip for training an artificial neural network, in accordance with some implementations.

FIG. 1 illustrates a schematic diagram of an electronic system that includes a chip 102 for training an artificial neural network, in accordance with some embodiments. The system includes a first type of RAM (e.g., MRAM 110) that is on-chip and, optionally, a second type of RAM, which may comprise one or more external (e.g., off-chip) devices, such as RAM chips 100. For example, RAM chips 100 comprise DRAM or another form of memory (e.g., that is distinct from magnetic RAM). In some implementations, the chip 102 includes a RAM interface 104 (e.g., a DDR3 interface) that facilitates communication between the chip 102 and the RAM chips 100. The chip 102 includes SRAM buffer(s)/cache(s) 108 for buffering data to be used by processor unit(s) 112 (e.g. CPUs or ALUs) during an ANN training process. For example, SRAM buffer(s)/cache(s) 108 buffers data stored off-chip (e.g., in RAM chips 100, which are external to the chip 102) and/or data stored in MRAM 110.

Although FIG. 1 illustrates embodiments in which a first type of memory (e.g., MRAM 110) resides on chip and a second type of memory (e.g., RAM chips 100) resides off chip, it should be understood that, in some implementations, chip 102 includes two distinct types of memory, including MRAM 110 and a second type of memory distinct from MRAM. For example, while RAM chips 100 are illustrated as separate from chip 102, it is to be understood that in some implementations, chip 102 includes MRAM and a type of memory distinct from MRAM.

In some embodiments, MRAM 110 is referred to as an "error-prone" memory. Although MRAM can be operated in an essentially error-free way (e.g., through suitable choice of read and write parameters, coupled with error correcting code), MRAM can also be operated in an error-prone fashion (e.g., by intentionally using too small of a read or write current, too short of a read or write pulse, and/or not using error correcting code). In contrast, types of memory other than MRAM, as described herein, are assumed, for the sake of description, to operate in an essentially error-free manner, and are thus referred to as "error-free" memories.

In some embodiments, MRAM 110 stores information needed to train the ANN. For example, in some embodiments, MRAM 110 stores values for some or all of an ANN's internal parameters (e.g., weights and biases), as well as values for activations calculated during a respective iteration, while the ANN is being trained. These values may be intermediate values (e.g., values calculated during a respective training iteration) rather than the final parameter values for the fully-trained ANN. In some embodiments, training data (e.g., labeled data) is also stored in MRAM 110.

In some embodiments, SRAM buffer(s)/cache(s) 108 caches data from MRAM 110 as needed so that it is available to the processing unit(s) 112 (e.g., an arithmetic logic unit (ALU)), which performs the calculations necessary to train the ANN (e.g., forward and backpropagation calculations and the like).

In some implementations, the ANN training process produces final values of the ANN parameters (e.g., values of weight and biases after the ANN has been fully trained), which are exported to a host computer via host interface 106.

In some implementations, processing unit(s) 112 executes instructions for training an ANN (e.g., instructions for performing the method 400). In some implementations, the instructions executable by the one or more processor unit(s) 112 are stored in a non-transitory computer-readable storage medium. In some implementations, the instructions are stored on chip 102. In some implementations, the instructions are stored off-chip (e.g., in RAM chips 100).

In some embodiments, the one or more processors (e.g., processor unit(s) 112) reside on the chip. In some embodiments, a non-transitory computer readable storage medium storing instructions for training the ANN resides on the chip 102. In some embodiments, the non-transitory computer-readable storage medium is loaded (e.g., written) with the instructions (e.g., from a host computer) when the chip 102 is powered-up. In some embodiments, the non-transitory computer-readable storage medium comprises a portion of RAM. In some embodiments, as described below, after training the ANN, chip 102 is used to classify untrained second data (e.g., is used for inference). After receiving the second data, the off-chip memory (e.g., RAM chips 100) stores some or all of the second data.

Figure 2:
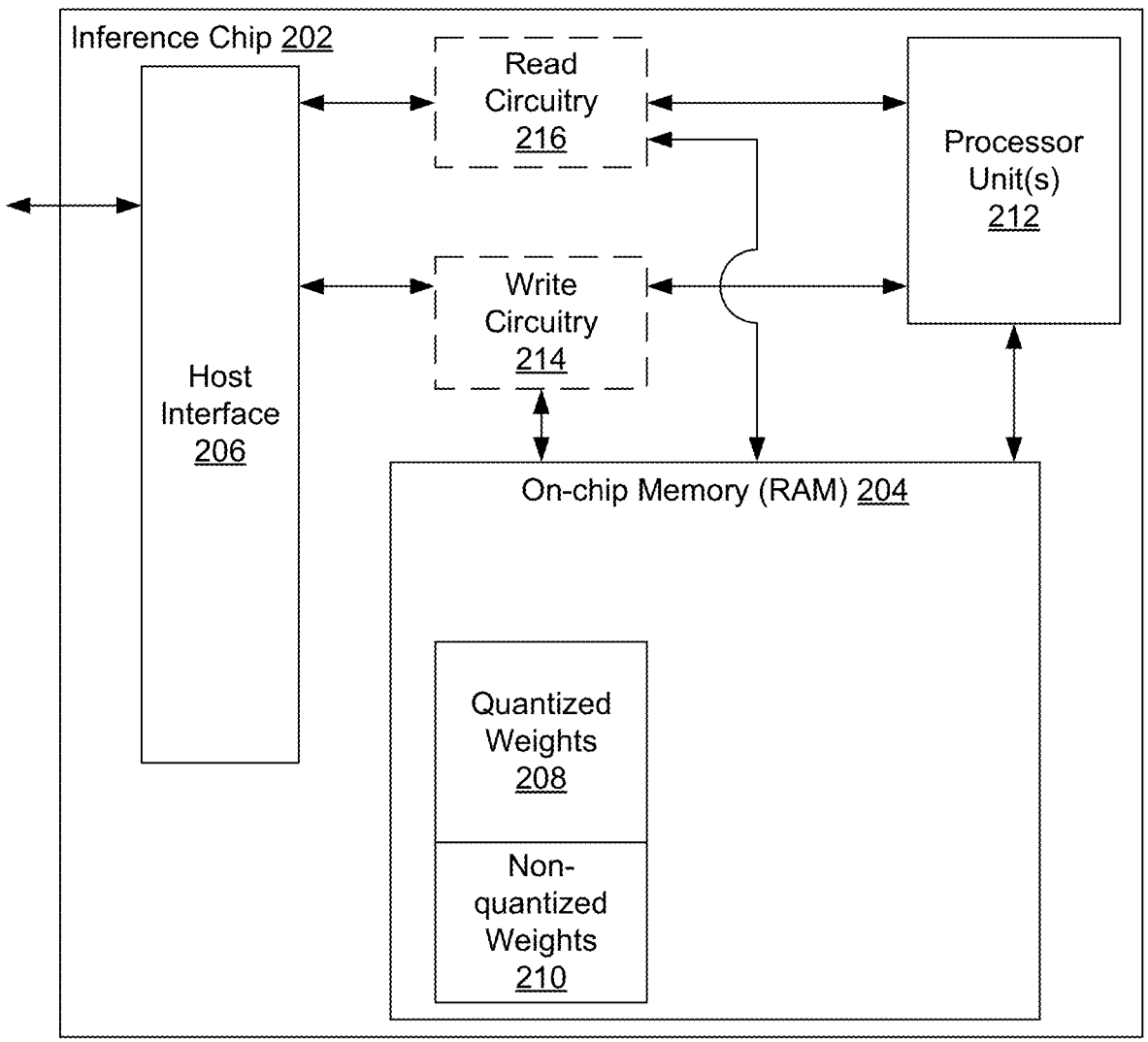
FIG. 2 illustrates a schematic diagram of a chip for classifying data using an artificial neural network (e.g., an inference chip), in accordance with some implementations.

FIG. 2 illustrates a schematic diagram of a chip 202 for classifying data using an artificial neural network (e.g., an inference chip), in accordance with some implementations. In some implementations, chip 202 includes on-chip memory 204 for storing internal parameters for an ANN (e.g., weights and biases). For example, in some embodiments, on-chip memory 204 stores trained weights for a plurality of layers of the ANN, including, in some circumstances, one or more quantized (e.g., binary) layers (stored as quantized weights 208) and one or more non-quantized (e.g., floating point) layers (e.g., stored as non-quantized weights 210).

In some implementations, chip 202 receives unclassified (e.g., unlabeled) data (e.g., through host interface 206) and classifies the unclassified data using the ANN's internal parameters stored in on-chip memory 204 (e.g., by reading the internal parameters using read circuitry 216).

To that end, in some implementations, chip 202 includes a host interface 206 (e.g., a PCIe interface), on-chip memory 204 (e.g., MRAM or RAM), and processor unit(s) 212. In some implementations, the on-chip memory 204 is communicatively coupled with write circuitry 214 for writing data (e.g., ANN weights calculated during training of the ANN) to the on-chip memory 204 and read circuitry 216 for reading data (e.g., values for the ANN weights) from the on-chip memory 204. Note that, for inference, the ANN's weights and biases only need to be written once (although in some circumstances, the ANN's weights and biases may refreshed periodically to correct, e.g., retention or read disturb errors). In some implementations, the read circuitry 216 includes word lines and bit lines (e.g., wires) and sets of corresponding transistors (e.g., for activating the word lines and bit lines). In some implementations, the read circuitry 216 includes or is coupled with memory storing the read parameters (e.g., magnitudes and/or pulse durations for reading from the MRAM).

It should be noted that, in some implementations, chip 102 also includes similar write circuitry and read circuitry, but for simplicity, those features are not shown in FIG. 1.

In some implementations, the chip 202 includes a non-transitory computer-readable storage medium storing instructions for receiving unlabeled data. In some implementations, the unlabeled data is data to be classified using a trained artificial neural network (ANN). The instructions further include instructions for, using the on-chip memory 204, classifying the unlabeled data using the neural network that includes at least one quantized (e.g., binarized) layer. The classifying includes reading values from the random access memory for a set of weights of the at least one quantized layer of the neural network using first read parameters corresponding to a first error rate.

In some implementations, chip 202 includes any or all of the modules of chip 102, as described with reference to FIG. 1.

Figure 3:
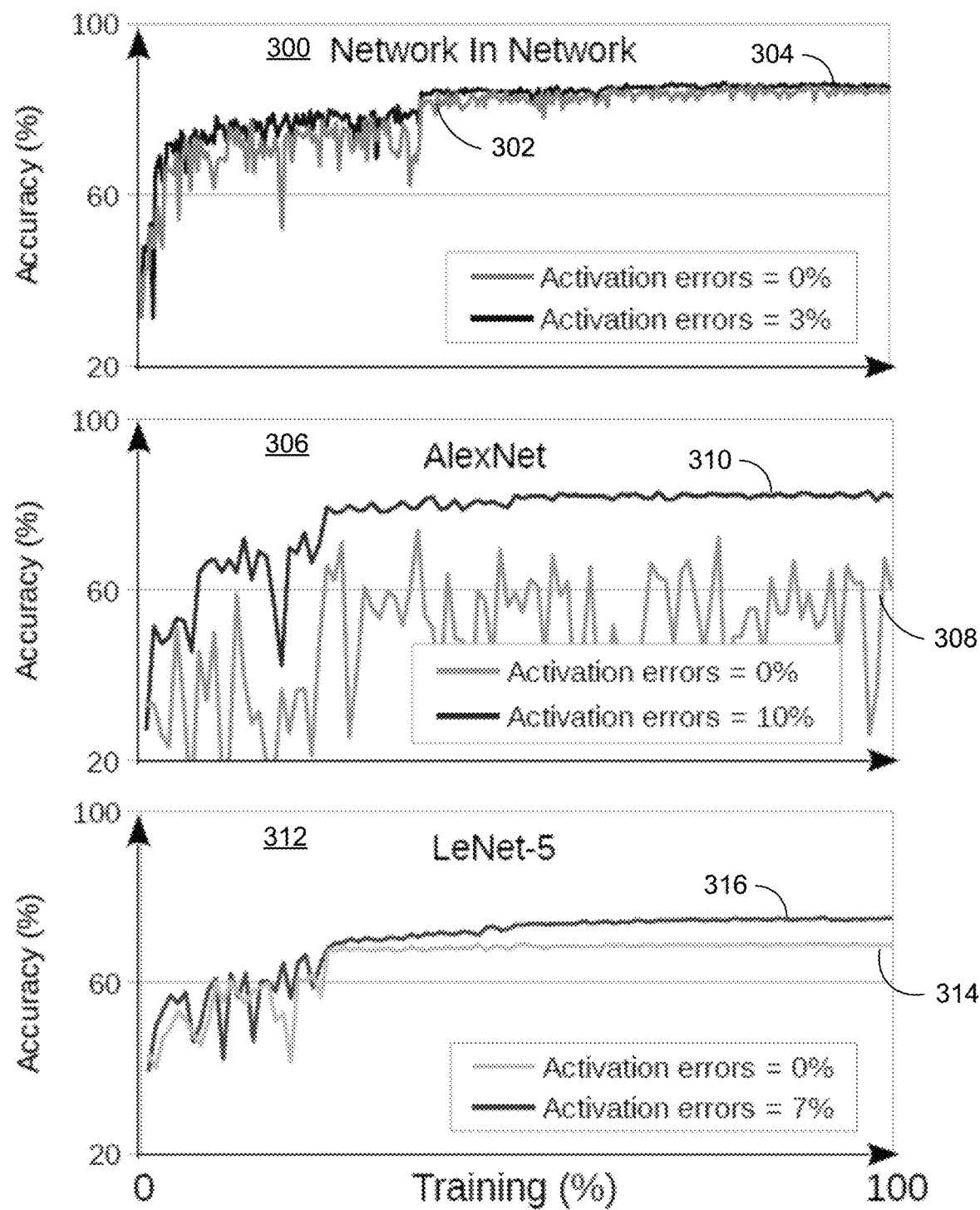
FIG. 3 illustrates the accuracy of training three exemplary neural networks at different activation error rates in accordance with some implementations.

As noted above, some embodiments of the present disclosure use error-prone memory (e.g., memory prone to write errors) to train a binary artificial neural network (ANN), specifically by stochastically writing activation values as a form of stochastic rounding. FIG. 3 illustrates graphs showing the accuracy of three ANNs (Network In Network, AlexNet, and LeNet-5), as a function of the percent of the training process that has been completed, using error-prone memory versus error-free memory. The accuracy shown in these graphs refers to the prediction accuracy in classifying unlabeled data (e.g., an instance of incorrect classification is considered a prediction error).

Note that the ANNs described in this example represent neural networks with at least one binarized layer (e.g., XNOR nets). The activation errors represented in FIG. 3 are write errors for the at least one binarized layer of the neural network (thus, the write error rate is referred to below as an "activation error rate").

Graph 300 illustrates the accuracy of a Network In Network (NIN) neural network as the training process proceeds. Plot 302 shows the accuracy of the NIN neural network trained with an activation error rate of 0% (e.g., using error-free memory), while plot 304 shows the accuracy of the NIN neural network when the at least one binizared layer is trained with an activation error rate of 3%. As illustrated by the graph 300, at least in some circumstances, training an NIN neural network with an activation error rate of 3% results in greater accuracy than using error-free memory (e.g., using deterministic rounding).

The results are even more dramatic in graph 306, which illustrates the accuracy of a AlexNet-like neural network over the course of training (i.e., a modified version of AlexNet, referred to herein as a "AlexNet" for simplicity). Plot 308 represents training the AlexNet network with an activation error rate of 0%. Plot 310 represents training the AlexNet network with an activation error rate of 10%. At least in some circumstances, training an AlexNet neural network with an activation error rate of 10% results in greater accuracy than using error-free memory.

Lastly, graph 312 illustrates the accuracy of a LeNet-5 neural network over the training process. Plot 314 illustrates training LeNet-5 with an activation error rate of 0%. Plot 316 represents the accuracy of training LeNet-5 with an activation error rate of 7%. Again, using an activation error rate of 7% results in final greater accuracy of LeNet-5.

FIG. 3 shows illustrative examples of how a higher activation error rate can result in more accurate training of neural networks. Using an error-prone memory, such as MRAM, in which the error-rate can be selected (e.g., by selecting corresponding write parameters), to train the neural network is thus more accurate than using error-free memory (e.g., SRAM).

Figure 4A:
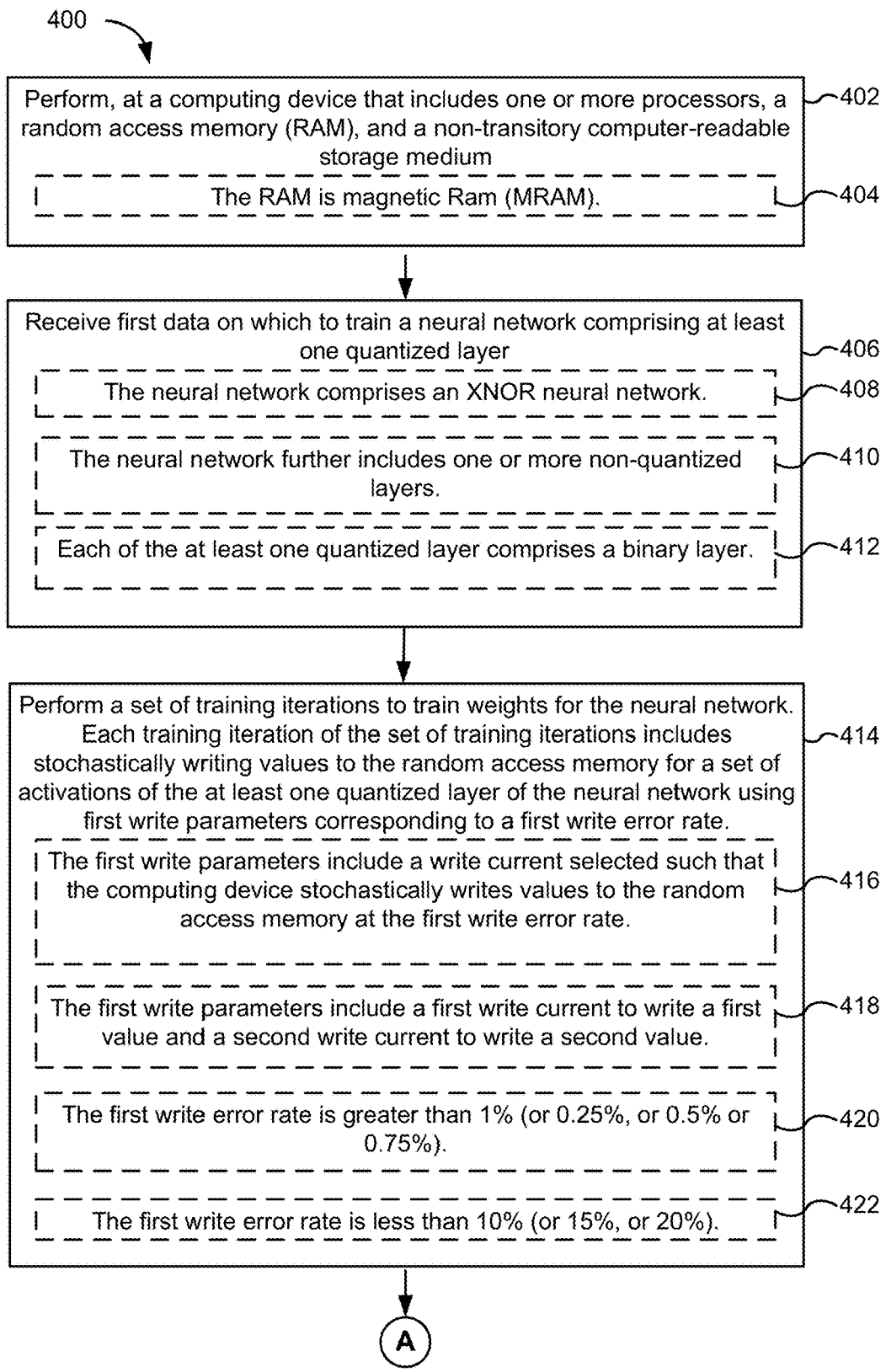
FIGS. 4A-4B illustrate a method for training an artificial neural network in accordance with some implementations.
Figure 4B:
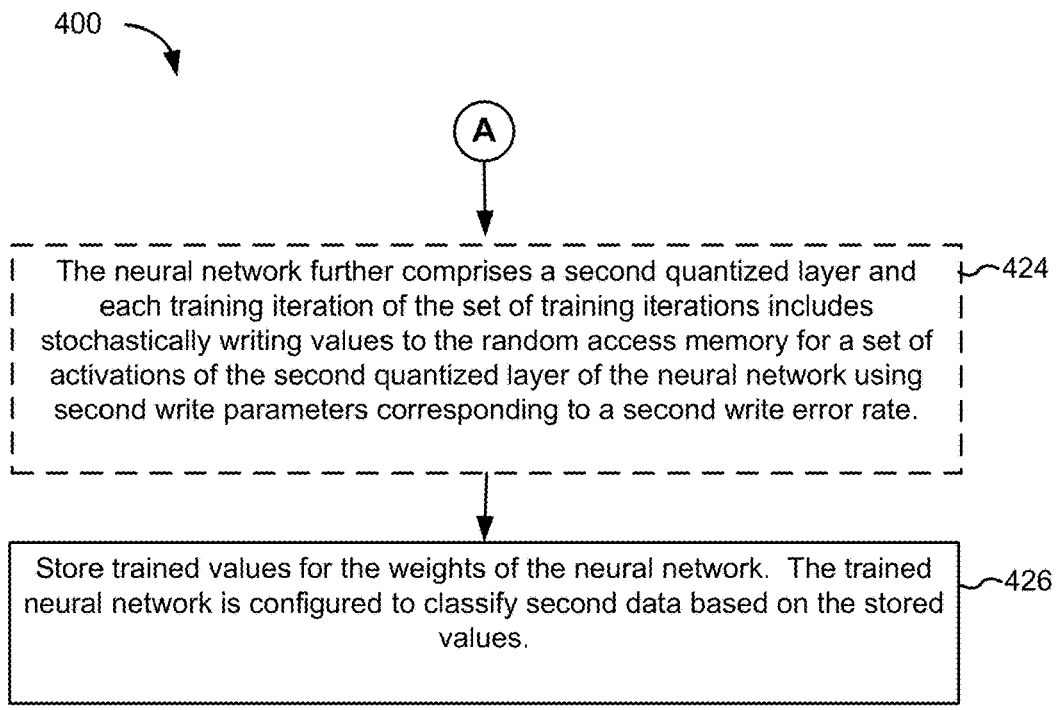

FIGS. 4A-4B illustrate a method 400 for training an artificial neural network in accordance with some implementations. Method 400 is performed at a computing device (402) (e.g., the computing device shown in FIG. 1) that includes one or more processors (e.g., processor unit(s) 112), a random access memory (RAM), and a non-transitory computer-readable storage medium having instructions for execution by the one or more processors.

In some implementations, the RAM is (404) magnetic RAM (MRAM) (e.g., MRAM 110 shown in FIG. 1).

Method 400 includes receiving (406) first data on which to train a neural network comprising at least one quantized layer (e.g., a fully-connected layer). In some implementations, the first data is stored in a database (e.g., stored on-chip or off-chip). In some implementations, the database is stored in the non-volatile memory. In some implementations, the first data is received in response to an instruction from a host (e.g., via host interface 106). In some implementations, the neural network comprises (408) an XNOR neural network. In some implementations, the neural network further includes (410) one or more non-quantized layers. For example, the neural network includes a combination of quantized (e.g., binarized) layers and floating point (e.g., non-binarized) layers. In some implementations, each of the at least one quantized layer comprises (412) a binary layer.

The method further includes performing (414) a set of training iterations (e.g., epochs) to train weights for the neural network. Each training iteration of the set of training iterations includes stochastically writing values to the RAM for a set of activations of the at least one quantized layer of the neural network using first write parameters corresponding to a first write error rate (e.g., the activation error rates discussed with reference to FIG. 3).

In some implementations, the first write parameters include (416) a write current selected such that the computing device stochastically writes values to the RAM at the first write error rate. In some embodiments, the computing device stochastically writes values when the values written to memory are different, at least some fraction of the time (e.g. with some frequency or probability) from the values specified in corresponding write commands. For example, writing values to MRAM at a first write current gives rise to the first write error rate, such that those values are written stochastically. In some embodiments, the first write current is selected in order to achieve the first write error rate.

In some implementations, the first write parameters include (418) a first write current to write a first value and a second write current to write a second value. In some implementations, the relative alignment of the fixed layer and free layer correspond to a high resistance state (e.g., anti-parallel) and a low resistance state (e.g., parallel). In some implementations, the first value written using the first write current corresponds to writing the high resistance state (or low resistance state). In some implementations, the second value written using the second write current corresponds to writing the low resistance state (or high resistance state). In some implementations, the first write error is (420) greater than 1% (or 0.25%, or 0.5% or 0.75%). In some implementations, the first write error is (422) less than 10% (or 15%, or 20%).

In some implementations, the neural network further comprises (424) a second quantized layer and each training iteration of the set of training iterations includes stochastically writing values to the random access memory for a set of activations of the second quantized layer of the neural network using second write parameters corresponding to a second write error rate. For example, the second write parameters include a second write current selected such that the computing device stochastically writes values to the RAM at the second write error rate. In some implementations, the second write error rate is the same as the first write error rate.

The method includes storing (426) the trained values for the weights of the neural network. The trained neural network is configured to classify second data based on the stored values.

In some embodiments, the MRAM comprises magnetic tunnel junctions (MTJs). In some embodiments, the MRAM comprises a spin-transfer torque (STT) memory. Data stored in the MRAM are encoded with using a relative orientation of two or more magnetic layers (e.g., a free layer and a reference data) in a bit. The value of the bit (e.g., the value of the data stored in the bit) can be determined based on the bit's resistance, which changes based on the relative orientation of the magnetizations because of the giant magnetoresistance effect (e.g., an anti-parallel arrangement of the respective magnetizations of free layer and the fixed layer has a different resistance than a parallel arrangement of the same).

In some embodiments, an MRAM bit is written by applying a current pulse (e.g., a write pulse having an amplitude and temporal length) to the MRAM bit, to switch the bit under the action of spin-transfer torque. The MRAM bit is read by applying a smaller pulse (e.g., a read pulse having a smaller amplitude and/or shorter temporal length) to the bit to determine its resistance. For some MRAMs (e.g., MTJs), there is an upper bound and a lower bound to the pulse amplitude and length. For example, when reading the bit, the voltage (and thus current) of the read pulse should be high enough and applied for long enough to allow the MTJ state to be determined (e.g., to allow the bit's resistance to be determined by a sense amplifier) but the voltage should not be so high, or the read pulse so long, that the data is disturbed (e.g., through the action of STT). When writing the bit, the voltage should be high enough and applied for long enough so that the information is correctly and reliably written, but not so high or for so long that the write pulse would stress or break the MTJ.

Thus, in various circumstances, there are the following types of error when reading and writing data to MRAM:

(a1) Write error: write errors occur when the write pulse voltage amplitude is not high enough (or the write pulse not long enough) to write the data to the MRAM. Depending on the voltage pulse and the characteristics of the MRAM, a probability of writing correctly can be determined.

(a2) Breakdown errors: breakdown errors occur when the write voltage amplitude for writing is so high (or the write pulse so long) that the MRAM bit is damaged due to breakdown of the device (e.g., in the case of an MTJ, breakdown of a tunnel oxide barrier).

(b) Retention error: retention errors occur when the MRAM does not retain (e.g., loses) the data that has been written to it. Depending on the characteristics of the MRAM and the idle time, the probability that the data is retained correctly can be determined.

(c1) Read error: read error occur when the applied voltage amplitude is not high enough (or the read pulse is not long enough) to detect the resistance state of the MRAM bit. These errors arise due to the sense amplifier, not the MRAM.

(c2) Read disturb error: read disturb errors occur when the read voltage is so high (or the read pulse is so long) that it disturbs the state of the MRAM bit (e.g., effectively writes the MRAM bit) while attempting to read it. The read disturb probability can be calculated from the read pulse and the MRAM characteristics. In some circumstances, read errors are preferable to read disturb errors. Thus, the read operations described herein are performed using read parameters that limit the number of read disturb errors (e.g., a read voltage and/or pulse length is below a respective threshold for causing read disturb errors, even at the cost of a greater number of read errors). One conventional way to mitigate the types of errors described above is to use an error-correcting code (ECC). Error-correcting code is costly, not only in terms of memory capacity but also because ECC slows down the process of reading memory.

In some implementations, at the end of the set of training iterations (e.g., during the final training iteration), the updated values for the set of weights and/or biases (and/or activations) of the ANN comprise final values, wherein the final values are stored such that the computing device can apply the final stored values to received second data (e.g., unclassified second data) in order to classify the second data. In some implementations, the intermediate stored values are stored in MRAM (e.g., on the chip) and the final stored values are stored in non-volatile off-chip memory. In some implementations, all immediate stored values are stored in (e.g., available from) MRAM and there is no need to bus data on and/or off chip. In some implementations, only a sub-portion of the intermediate stored values are stored in MRAM.

In some implementations, after training the neural network, the computing device receives second data (e.g., untrained data); and assigns scores to the second data using the stored values of the trained neural network. In some implementations, after assigning scores (e.g., classifying) the second data using the stored (final) values of the trained neural network, the computing device provides the assigned scores to a host device (e.g., via host interface 106).

In some implementations, an electronic system (e.g., system shown in FIG. 1) is provided. The electronic system includes one or more processors, a random access memory (RAM), and a non-transitory computer-readable storage medium storing instructions executable by the one or more processors. The instructions include instructions for receiving first data on which to train a neural network comprising at least one quantized layer. The instructions include instructions for performing a set of training iterations to train weights for the neural network, each training iteration of the set of training iterations including stochastically writing values to the random access memory for a set of activations of the at least one quantized layer of the neural network using first write parameters corresponding to a first write error rate. The instructions include instructions for storing trained values for the weights of the neural network, wherein the trained neural network is configured to classify second data based on the stored values.

In some implementations, the electronic system includes a chip (e.g., chip 102). In some embodiments, the RAM (e.g., MRAM 110) resides on the chip 102. In some embodiments, the one or more processors (e.g., processor unit(s) 112) reside on the chip. In some embodiments, the one or more processors comprise an arithmetic logic unit (ALU). In some embodiments, a non-transitory computer readable storage medium resides on the chip. In some embodiments, the non-transitory computer-readable storage medium is loaded (e.g., written) with the instructions when the chip is powered-up. In some embodiments, the non-transitory computer-readable storage medium comprises a portion of first RAM or second RAM. In some embodiments, the electronic system includes an off-chip memory (e.g., DRAM, HBM, RAM chips 100) that holds some or all of the first data during the first set of training iterations and/or the second set of training iterations (e.g., the first data is bussed on and off the chip as needed during the first and second sets of iterations). Likewise, in some embodiments, after receiving the second data, the off-chip memory stores some or all of the second data (e.g., while the scores are being assigned to the second data). In some embodiments, an off-chip memory (e.g., a non-volatile memory) stores the instructions when the chip is powered off. In some embodiments, the chip includes a buffer (e.g., SRAM buffer(s)/cache(s) 108) that is communicatively coupled with the off-chip memory. In some embodiments, the buffer comprises a portion of the first RAM or the second RAM. In some implementations, the electronic system is configured to perform any of the operations of method 400.

Figure 5:
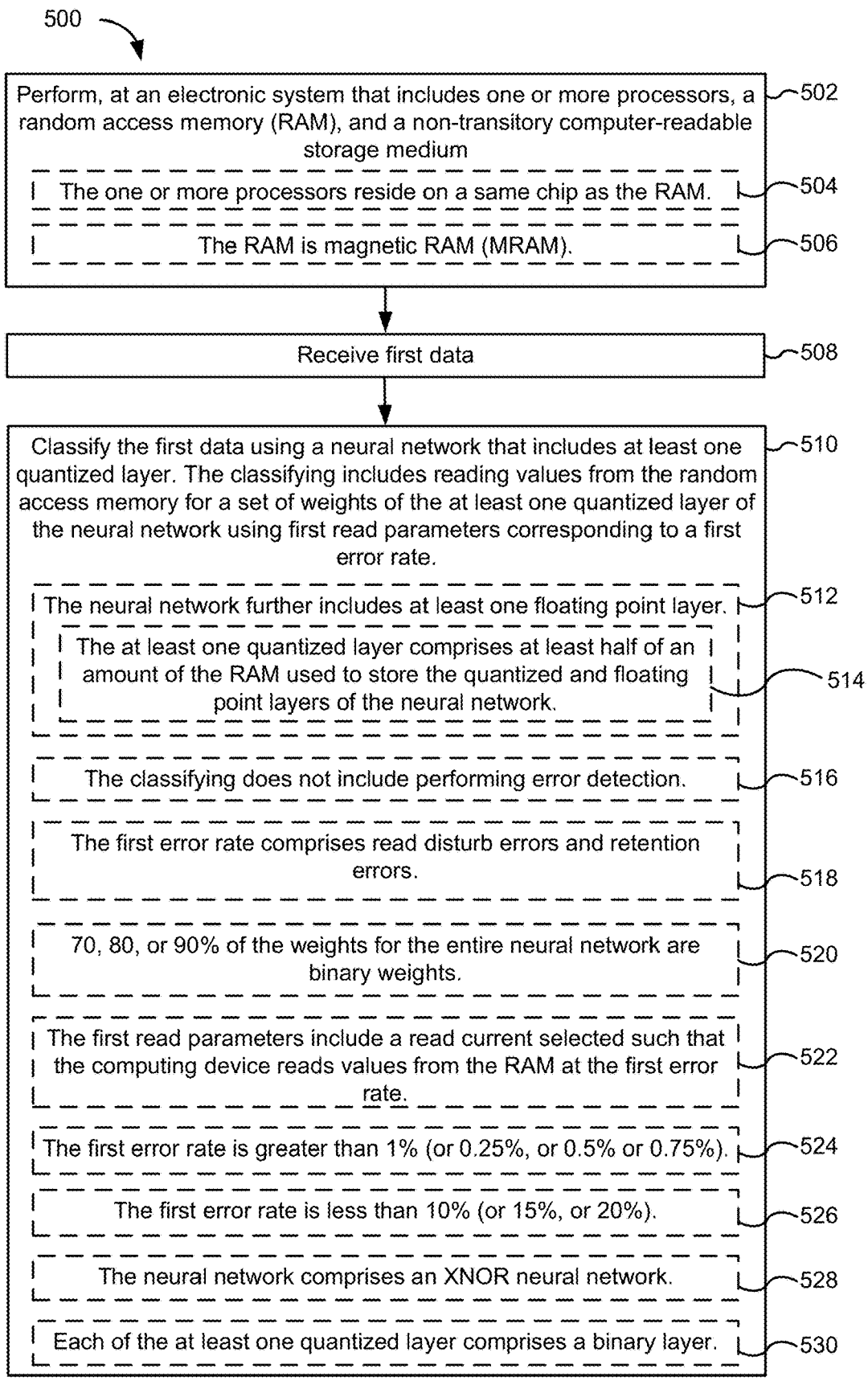
FIG. 5 illustrates a method for classifying data using an artificial neural network in accordance with some implementations.

FIG. 5 illustrates a method 500 for classifying data using a neural network. The method 500 is performed (502) at a computing device (e.g., chip 202 as shown in FIG. 2) that includes one or more processors, random access memory (RAM), and a non-transitory computer-readable storage medium storing instructions for execution by the one or more processors. In some implementations, the RAM is (504) on the same chip as the one or more processors. For example, the set of weights for the entirety of the quantized layer is stored on the same chip as the one or more processors that classify the data. In some implementations, the RAM is (506) magnetic RAM (MRAM).

The method includes receiving (508) first data (e.g., to be classified by a neural network).

The method includes classifying (510) the first data using a neural network that includes at least one quantized (e.g., binary) layer (e.g., a fully-connected layer). The classifying includes reading values from the random access memory for a set of weights of the at least one quantized layer of the neural network using first read parameters corresponding to a first error rate. Various types of errors are discussed above with reference to method 400 (FIGS. 4A-4B). For brevity, those details are not repeated here. The error rates described herein can refer to, in accordance with various embodiments, a specific error rate (e.g., an error rate for a specific type of error) or a net-error rate (e.g., a rate based on the combination of errors because (I) the stored value for the weight is wrong (e.g., a write error, a retention error, or a read disturb error); and (II) the stored value for the weight is correct but it was read incorrectly).

In some embodiments, values for weights of different quantized layers are read with different error rates. To that end, in some embodiments, the at least one quantized layer is a first quantized layer and the neural network includes a second quantized (e.g., binary) layer (e.g., a fully-connected layer). The set of weights is a first set of weights. The classifying includes reading values from random access memory for a second set of weights of the second quantized layer of the neural network using second read parameters (e.g., different from the first read parameters) corresponding to a second error rate (e.g., different from the first error rate). In some embodiments, the random access memory from which the second set of weights is read is the same random access memory as the random access memory from which the first set of weights is read. In some embodiments, the random access memory from which the second set of weights is read is different random access memory (e.g., different MRAM) from the random access memory from which the first set of weights is read, operated with different read parameters (e.g., different read currents) to give rise to the second error rate.

In some implementations, the neural network further includes (512) at least one floating point (e.g., non-quantized) layer.

Figure 7:
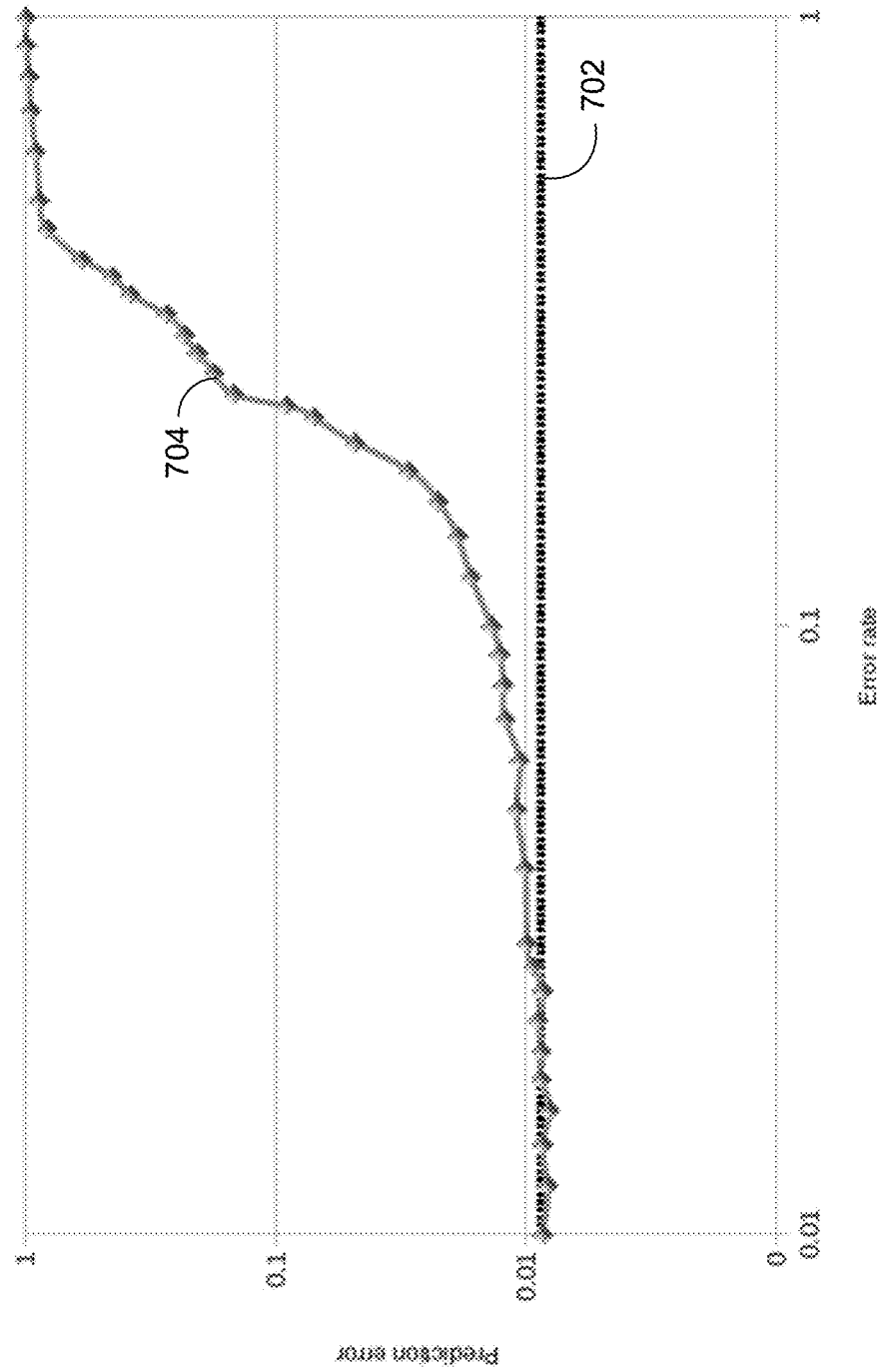
FIG. 7 illustrates the prediction error at different error rates using an inference chip in accordance with some implementations.

Note that the bulk of the memory in many ANNs is needed to store the weight values for a few—and sometimes just one—layers. Quantizing these layers relaxes the memory requirements (e.g., in a binary layer, a single-bit representation is used to store the value of a weight). Even so, in some implementations, the at least one quantized layer comprises at least half of an amount of the RAM used to store the quantized and floating point layers of the neural network. Using SRAM to store all of these quantized values entails considerable energy cost and requires large on-chip area. Thus, in some implementations, data corresponding to the binarized layers are stored on error-prone memory (e.g., MRAM 110). As shown in FIG. 7, storing these binary weights in memory with read errors up to 5 or 10% in this example does not adversely affect the accuracy of the inference process (at least not too severely, and in some cases, hardly at all). This error-prone memory, especially in the case of MRAM, can be made denser than error free memory, reducing the necessary on-chip memory area.

In some implementations, the classifying does not include (516) performing error detection. For example, the computing device classifies the data with the first error rate (e.g., corresponding to the error rate at which the MRAM is operated). For example, as described below with reference to FIG. 7, classifying data with an error rate (e.g., below a threshold error rate) produces predictions (e.g., classifications) that are nearly accurate to the performance achieved using error-free memory. Because the predictions maintain accuracy despite an error rate in operating the MRAM, the memory-intensive weights are stored in error-prone memory and are used to classify data without the need for error correction. The precise threshold will depend on the requirements of the classification process as well as the neural network being used. For example, in an LeNet neural network, the first fully-connected layer has 94% of the weights. For this network, a read error rate less than 2.5% in the first fully-connected layer there does not change inference accuracy of the neural network. This indicates that 94% of the memory used by the neural network can be replaced with error-prone memory (e.g., MRAM) and then operate the MRAM under conditions that would be associated with read error rate up to 2.5%. The rest of the network may remain on SRAM. (Alternatively the entire network can be held in MRAM and then part of the network can operate with stringent error rate requirements (including perhaps an error correcting scheme), while the memory-intensive layers can operate with lax error rate requirements.

As another example, of the 138 M parameters in a VGGNet, 103 M (74%) are in the first fully-connected layer and 17 M (12%) are in the second fully-connected layer.

Overall these two FC layers require 86% of the total number of parameters. Following the same approach, most of the memory needed by the VGGNet (e.g. the memory needed for first and second fully connected layers) can be replaced with MRAM on inference chips with the condition that the error rate in each layer does not exceed a given threshold. This threshold can be relatively high, 0.2%-2%, to enable very efficient operation.

Allowing for MRAM with relaxed error rate requirements facilitates smaller MTJs, namely higher density, higher speed, higher energy efficiency and better endurance. This is in stark contrast with regular MRAM operation, where very low error rates (below $10^{-6}$) are usually required, which also necessitates some kind of error correction scheme. It also contrasts with SRAM, which makes no errors at the cost of lower energy efficiency and larger area. In addition, larger area can result in the need to go off-chip, which has disastrously high energy cost.

In some implementations, the first error rate comprises (518) read disturb errors and retention errors.

In some implementations, 50%, 60%, 70%, 80%, or 90% of the weights for the entire neural network are (520) binary (e.g., quantized) weights. For example, the values of the weights are stored on the same chip as the one or more processors that classify the data.

In some implementations, the first read parameters include (522) a read current selected such that the computing device reads values from the RAM at the first error rate. In some implementations, the first error rate is (524) greater than 1% (or 0.25%, or 0.5% or 0.75%). In some implementations, the first error rate is (526) less than 10% (or 15%, or 20%). In some implementations, the errors (reflected by the first error rate) include retention errors and read errors. For example, the weights of the trained neural network do not change (e.g., during writing) except due to a retention failure or a read disturb.

In some implementations, the neural network comprises (528) an XNOR neural network. In some implementations, each of the at least one quantized layer comprises (530) a binary layer.

In some implementations, an electronic system is provided. The system includes one or more processors, magnetic random access memory (MRAM), read circuitry configured to read data to the MRAM and a non-transitory computer-readable storage medium storing instructions for execution by the one or more processors. In some embodiments, the read circuitry includes word lines and bit lines (e.g., wires) and sets of corresponding transistors (e.g., for activating the word lines and bit lines). In some embodiments, the read circuitry includes or is coupled with memory storing the first read parameters and second read parameters. The stored instructions include instructions for receiving first data. The instructions further include instructions for, classifying the first data using a neural network that includes at least one quantized layer. The classifying includes reading values from the random access memory for a set of weights of the at least one quantized layer of the neural network using first read parameters corresponding to a first error rate.

In some implementations, the electronic system includes a chip (e.g., chip 202). In some embodiments, the RAM resides on the chip. In some implementations, the electronic system includes a smartphone (e.g., that includes the chip).

In some embodiments, the one or more processors reside on the chip. In some embodiments, the one or more processors comprise an arithmetic logic unit (ALU). In some embodiments, a non-transitory computer readable storage medium resides on the chip. In some embodiments, the non-transitory computer-readable storage medium is loaded (e.g., written) with the instructions when the chip is powered-up. In some embodiments, the non-transitory computer-readable storage medium comprises a portion of MRAM. In some embodiments, the electronic system includes an off-chip memory (e.g., DRAM, HBM) that holds some or all of the first data during the first set of training iterations and/or the second set of training iterations (e.g., the first data is bussed on and off the chip as needed during the first and second sets of iterations. In some embodiments, an off-chip memory (e.g., a non-volatile memory) stores the instructions when the chip is powered off. In some embodiments, the chip includes a buffer that is communicatively coupled with the off-chip memory. In some embodiments, the buffer comprises a portion of the MRAM. In some embodiments, the buffer comprises a memory of type distinct from MRAM (e.g., SRAM).

In some implementations, the electronic system is configured to perform any of the operations described with reference to method 500.

Figure 6A:
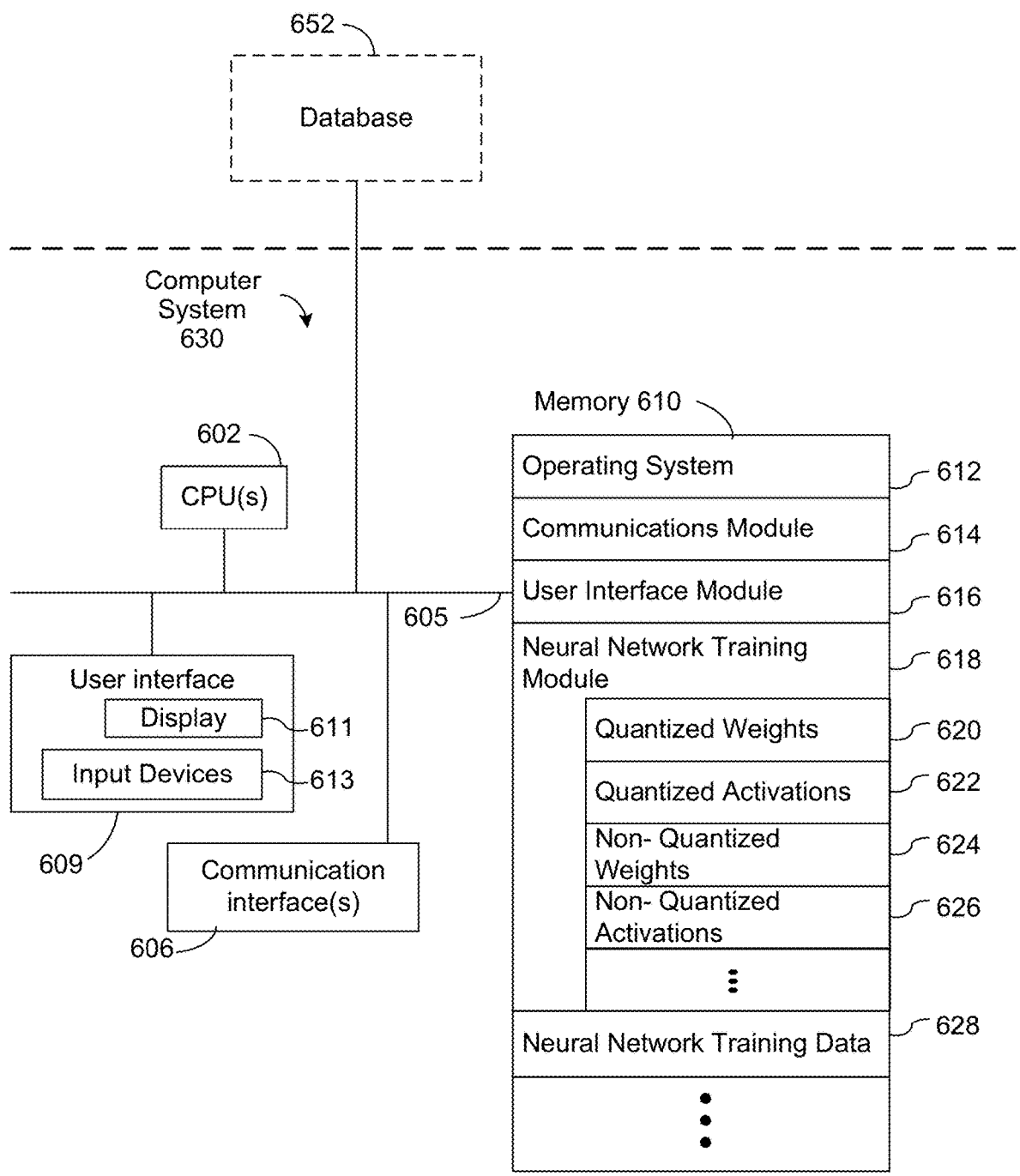
FIG. 6A is a block diagram of a computer system for training an artificial neural network in accordance with some implementations.

FIG. 6A is a block diagram of a computer system 630 for training an artificial neural network, according to some embodiments. Computer system 630 typically includes one or more processing unit(s) 602 (e.g. CPUs or ALUs) for executing programs or instructions; memory 610; one or more communications interfaces 606; and one or more communication buses 605 for interconnecting these components. In some embodiments, processing unit(s) 602 include the chips 102/202 shown and described with reference to FIGS. 1-2. Computer system 630 optionally includes a user interface 609 comprising a display device 611 and one or more input devices 613 (e.g., one or more of a keyboard, mouse, touch screen, keypad, etc.) coupled to other components of computer system 630 by the one or more communication buses 605. The one or more communication buses 605 may include circuitry (sometimes called a chipset) that interconnects and controls communications between system components.

Communication interface 606 is used by computer system 630 to convey information to external systems, and to receive communications from external systems, such as external database 652 (e.g., which may store ANN training data or data to be classified by a trained ANN). The connection between computer system 630 and external database 652 may include a communication network such as the internet or a public or proprietary wireless network.

Memory 610 includes MRAM (e.g., MRAM 110, FIG. 1). In some embodiments, memory 610 also includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. Memory 610 optionally includes one or more storage devices remotely located from the processing unit(s) 602. Memory 610, or alternately the non-volatile memory device(s) within memory 610, comprises a computer readable storage medium. In some embodiments, memory 610 or the computer readable storage medium of memory 610 stores the following programs, modules and data structures, or a subset thereof:

an operating system 612 that includes procedures for handling various basic system services and for performing hardware dependent tasks;

- a communications module 614 that operates in conjunction with communication interface 606 to handle communications between computer 130 and external systems;
- a user interface module 616 for receiving information from one or more input device 613 of user interface 609, and to convey information to a user of computer system 630 via one or more display devices 611;
- a neural network training module 618 for training an artificial neural network (e.g., causing the system to perform any of the ANN training and/or classifying methods described herein), including storing and classifying data based on:
  - quantized weights 620 stored by stochastically writing values of the weights. Note that in some circumstances, quantized weights 620 may also include some deterministically written weights;
  - quantized activations 622 stored by stochastically writing values of the activations using error-prone memory. Note that in some circumstances, quantized activations 622 may also include some deterministically written activations;
  - non-quantized weights 624 stored as floating point values; and
  - non-quantized activations 626 stored as floating point values; and
- neural network training data 628 used for training artificial neural networks (e.g., sets of inputs and labels indicating correct classifications).

Operating system 612 and each of the above identified modules and applications correspond to a set of instructions for performing a function described above. The set of instructions can be executed by the processing unit(s) 602 of computer system 630. The above identified modules, applications or programs (i.e., sets of instructions) need not be implemented as separate software programs, procedures or modules, and thus various subsets of these modules may be combined or otherwise re-arranged in various embodiments. In some embodiments, memory 610 stores a subset of the modules and data structures identified above. Furthermore, memory 610 optionally stores additional modules and data structures not described above.

FIG. 6A is intended more as a functional description of the various features which may be present in a computer system 630 than as a structural schematic of the embodiments described herein. In practice, and as recognized by those of ordinary skill in the art, items shown separately could be combined and some items could be separated. For example, some items shown separately in FIG. 6A could be combined into a single module or component, and single items could be implemented using two or more modules or components. The actual number of modules and components, and how features are allocated among them will vary from one implementation to another.

In addition, in some embodiments, some or all of the above-described functions may be implemented with hardware circuits (e.g., field programmable gate arrays (FPGAs), application specific integrated circuits (ASICs), a "system on a chip" that includes processors and memory, or the like). To that end, in some embodiments, processing unit(s) 602 include specialized hardware for performing these and other tasks.

Figure 6B:
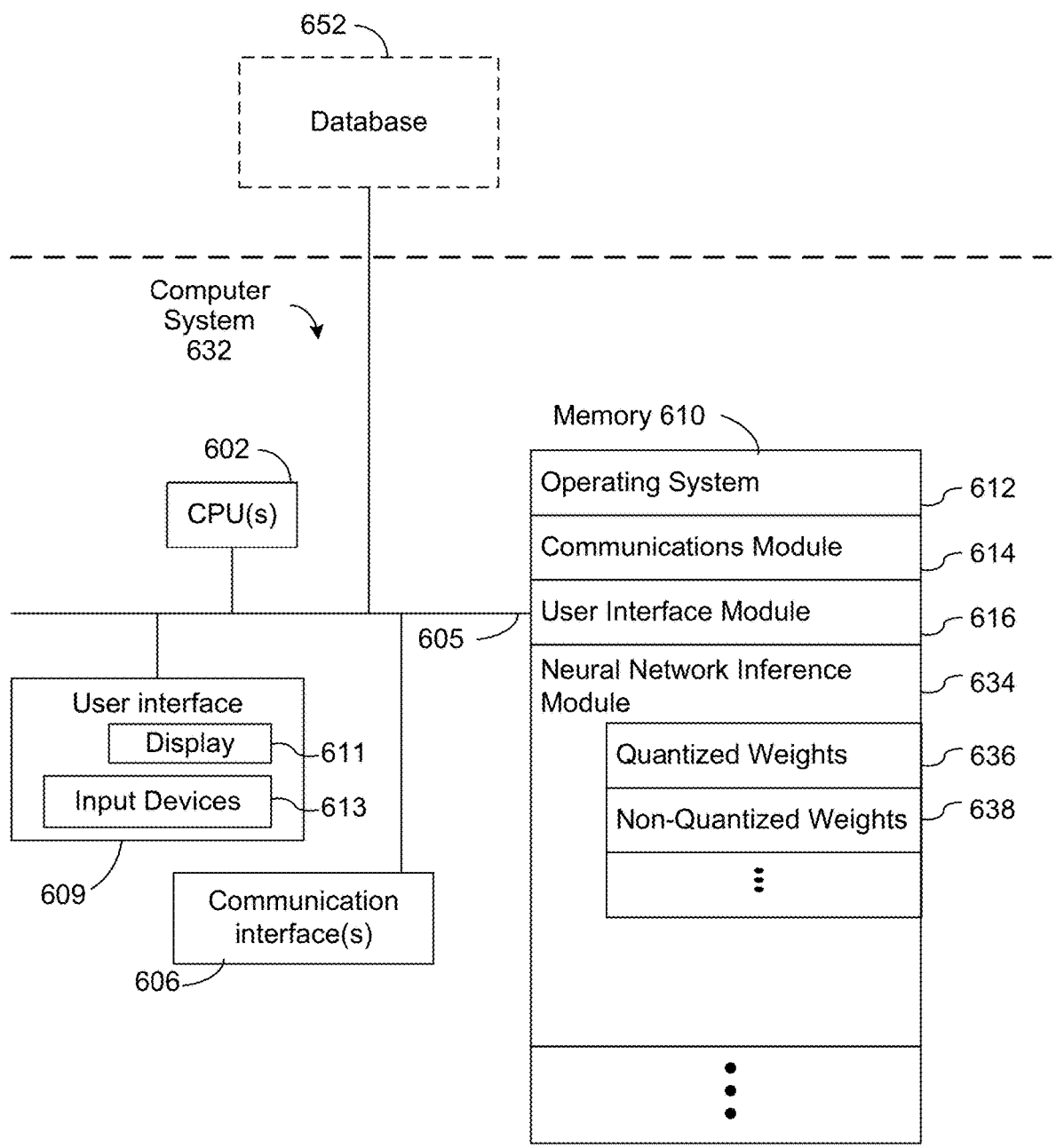
FIG. 6B is a block diagram of a computer system for classifying data using an artificial neural network in accordance with some implementations.

FIG. 6B is a block diagram of a computer system 632 for classifying data using an artificial neural network in accordance with some implementations. Computer system 632 shares many components with computer system 630 (FIG. 6A). For brevity, those details are not repeated here. Computer system 632 differs from computer system 630 in that memory 610 of computer system 632 stores a neural network inference module 634. The neural network inference module 634 includes a set of trained weights (e.g., quantized weights 636 and non-quantized weights 638). The neural network inference module 634 is used to classify unlabeled data (e.g., in accordance with method 500, FIG. 5). In some embodiments, the unlabeled data is received from an external source (e.g., external database 652). In some embodiments, the unlabeled data is acquired by the computer system 632. For example, input devices 613 may include a camera that is used to acquire an image. One or more features of the image can be classified using the neural network inference module 634 (e.g., one or more people in the image can be identified using neural network inference module 634). Because the embodiments described herein reduce the size of the on-chip memory needed for inference, in some embodiments, the system computer 632 is a portable multifunction device (e.g., a tablet, smartphone, smart watch) etc. In some embodiments, the computer system 632 has dimensions less than 8 inches by 6 inches by 1 inch.

FIG. 7 illustrates a prediction error rate for classifying MNIST data using a trained LeNet 5 neural network. Baseline 702 represents the prediction error (e.g., the rate at which the neural network does not accurately classify the data) for a neural network operated on error-free memory (e.g., SRAM). As shown in the Figure, the baseline 702 illustrates that the prediction error is less than 1% in error-free memory.

Prediction error 704 represents the prediction error of classifying data using a neural network operated on error-prone memory for the first fully connected layer (e.g., MRAM) at different error rates (e.g., error rates for reading binary weights of an ANN). (Note that the baseline 702 is the y-intercept of the prediction error 704). In some implementations, the error rates represent read errors and/or retention errors of the memory. As shown, the prediction error 704 closely resembles the baseline 702 when the error rate is under a threshold value (e.g., less than 3%, 5%, or 10%, depending on the accuracy requirements). This illustrates that an error-prone memory can be used to store binary weights of an ANN without affecting the ANN's prediction error.

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

It will also be understood that, although the terms first, second, etc. are, in some instances, used herein to describe various elements, these elements should not be limited by these terms. These terms are only used to distinguish one element from another. For example, a first electronic device could be termed a second electronic device, and, similarly, a second electronic device could be termed a first electronic device, without departing from the scope of the various described implementations. The first electronic device and the second electronic device are both electronic devices, but they are not the same type of electronic device.

The terminology used in the description of the various described implementations herein is for the purpose of describing particular implementations only and is not

What is claimed is:

1. A method, comprising:
performing, at a computing device that includes one or more processors, a random access memory (RAM), and a non-transitory computer-readable storage medium including instructions for execution by the one or more processors, a set of operations including:
receiving first data on which to train a neural network comprising at least one quantized layer;
performing a set of training iterations to train weights for the neural network, each training iteration of the set of training iterations including stochastically writing activation values as a form of stochastic rounding, to the random access memory, for a set of activations of the at least one quantized layer of the neural network using first write parameters corresponding to a first write error rate; and
storing trained values for the weights of the neural network, wherein the trained neural network is configured to classify second data based on the stored trained values.

2. The method of claim 1, wherein the RAM is magnetic RAM.

3. The method of claim 2, wherein the first write parameters include a write current selected such that the computing device stochastically writes values to the random access memory at the first write error rate.

4. The method of claim 1, wherein the first write parameters include a first write current to write a first value and a second write current to write a second value.

5. The method of claim 1, wherein the first write error rate is greater than 0.5%.

6. The method of claim 5, wherein the first write error rate is less than 20%.

7. The method of claim 1, wherein the neural network comprises an XNOR neural network.

8. The method of claim 1, wherein the neural network further includes one or more non-quantized layers.

9. The method of claim 1, wherein each of the at least one quantized layer comprises a binary layer.

10. The method of claim 1, wherein the neural network further comprises a second quantized layer and each training iteration of the set of training iterations includes stochastically writing values to the random access memory for a set of activations of the second quantized layer of the neural network using second write parameters corresponding to a second write error rate.

11. An electronic system comprising:
one or more processors;
a random access memory (RAM);
a non-transitory computer-readable storage medium including instructions for:
receiving first data on which to train a neural network comprising at least one quantized layer;
performing a set of training iterations to train weights for the neural network, each training iteration of the set of training iterations including stochastically writing activation values as a form of stochastic rounding to the random access memory for a set of activations of the at least one quantized layer of the neural network using first write parameters corresponding to a first write error rate; and
storing trained values for the weights of the neural network, wherein the
trained neural network is configured to classify second data based on the stored values.

12. The electronic system of claim 11, wherein the electronic system comprises a chip.

13. The electronic system of claim 11, wherein the RAM is magnetic RAM.

14. The electronic system of claim 11, wherein the first write parameters include a first write current to write a first value and a second write current to write a second value.

15. The electronic system of claim 11, wherein the first write error rate is greater than 0.5%.

16. The electronic system of claim 15, wherein the first write error rate is less than 20%.

17. The electronic system of claim 11, wherein the neural network comprises an XNOR neural network.

18. The electronic system of claim 11, wherein the neural network further includes one or more non-quantized layers.

19. The electronic system of claim 11, wherein each of the at least one quantized layer comprises a binary layer.

20. The electronic system of claim 11, wherein the neural network further comprises a second quantized layer and each training iteration of the set of training iterations includes stochastically writing values to the random access memory for a set of activations of the second quantized layer of the neural network using second write parameters corresponding to a second write error rate.

* * * * *